United States Patent
Lai

(10) Patent No.: US 8,757,837 B2
(45) Date of Patent: Jun. 24, 2014

(54) LED LIGHT BAR AND METHOD FOR MANUFACTURING THE SAME

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 393 days.

(21) Appl. No.: 13/245,882

(22) Filed: Sep. 27, 2011

(65) Prior Publication Data

US 2012/0182746 A1 Jul. 19, 2012

(30) Foreign Application Priority Data

Jan. 17, 2011 (TW) .............................. 100101611 A

(51) Int. Cl.
*F21V 21/00* (2006.01)
*F21K 99/00* (2010.01)
*H05K 3/34* (2006.01)

(52) U.S. Cl.
CPC ... *F21K 9/30* (2013.01); *F21K 9/90* (2013.01); *H05K 3/3452* (2013.01); *Y10S 362/80* (2013.01)

USPC ........ 362/249.02; 362/382; 362/800; 29/829; 257/99

(58) Field of Classification Search
CPC ............... F12K 9/00; F12K 9/30; F12K 9/90; H01L 33/486; H05K 3/3494; H05K 3/3452
USPC ........................... 29/829; 257/99; 362/23.07, 362/249.02–249.06, 382, 545, 800
See application file for complete search history.

(56) References Cited

U.S. PATENT DOCUMENTS

| | | | |
|---|---|---|---|
| 4,742,432 A * | 5/1988 | Thillays et al. ................ | 362/800 |
| 8,373,194 B2 * | 2/2013 | Elzinga ........................... | 257/99 |

* cited by examiner

*Primary Examiner* — Stephen F Husar
(74) *Attorney, Agent, or Firm* — Novak Druce Connolly Bove + Quigg LLP

(57) ABSTRACT

An LED light bar includes a plurality of LEDs and a circuit board supporting the LEDs. Solder points are formed on a bottom surface of the LEDs. An anti-solder layer is coated on the circuit board so as to create a plurality of discrete anti-solder pads. A first tenon which is formed on each of the LEDs locates in a void in a corresponding one of the anti-solder pads so as to position the LEDs precisely on the circuit board and maintain their positions.

10 Claims, 3 Drawing Sheets

Provide an LED, a solder point is arranged on a bottom surface of the LED, the LED having a first engaging unit Provide a circuit board, an anti-solder layer is arranged on a top surface of the circuit board, the anti-solder layer forms a plurality of anti-solder pads, a solder area respectively formed by the adjacent solder layers is used for connecting to the solder point of the LED, a second engaging unit arranged on a part of the anti-solder pad Arrange the LED on the circuit board, the first engaging unit of the LED is embedded into the second engaging unit having at least one anti-solder pad, and the solder point connects to the solder area

FIG. 3

LED LIGHT BAR AND METHOD FOR MANUFACTURING THE SAME

BACKGROUND

1. Technical Field

The disclosure relates to light emitting diodes, and particularly to an LED light bar and a method for manufacturing the LED light bar.

2. Description of the Related Art

Light emitting diodes (LEDs) have many advantages, such as high luminosity, low operating voltage, low power consumption, compatibility with integrated circuits, long term reliability, and environmental friendliness which have promoted their wide use as a light source. Now, light emitting diodes are commonly applied in environmental lighting.

A common LED light bar includes a circuit board and a plurality of LEDs arranged on the circuit board. A method for manufacturing the common LED light bar is that solder paste is coated on solder points arranged on the bottom surface of the common LED. The LED is arranged on the circuit board and the solder points are arranged on the connection areas of the circuit board. And then, an electrically connection is completed by a reflow process. However, the solder points may be misaligned with the connection areas of the circuit board because the melting solder causes the LED to shift. That affects the quality of the LED light bar.

Therefore, it is desirable to provide a particularly to an LED light bar and a method for manufacturing the LED light bar which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED light bar and a method for manufacturing the LED light bar. Moreover, in the drawings, like reference numerals designate corresponding parts throughout the views.

FIG. 3 is the process flow of the manufacturing of the LED light bar of FIG. 1.

DETAILED DESCRIPTION

Embodiments of an LED light bar and a method for manufacturing the LED light bar as disclosed are described in detail here with reference to the drawings.

Figure 1:
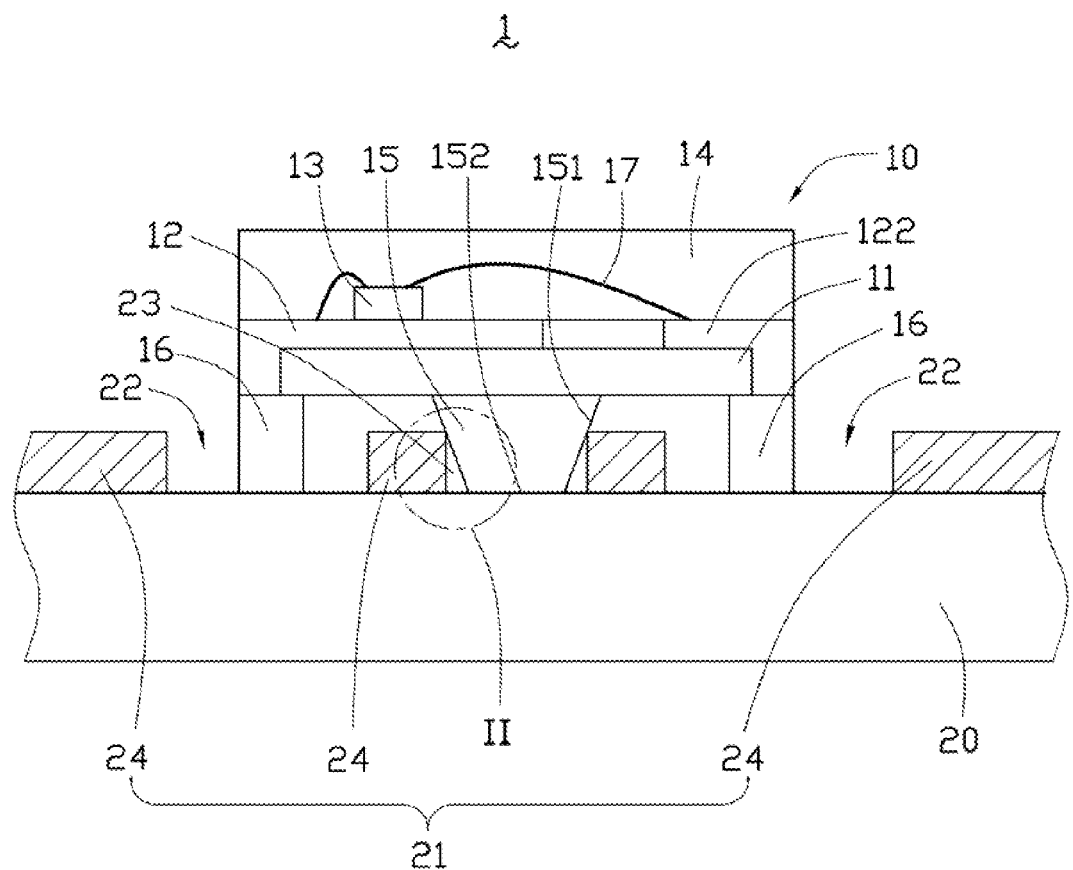
FIG. 1 is a cross-sectional view of an LED light bar in accordance with a first embodiment.

Referring to FIG. 1, an LED light bar 1 includes an LED 10, and a circuit board 20 supporting the LED 10.

The LED 10 includes a substrate 11, a first electrode 12 and a second electrode 122 arranged on the substrate 11, an LED chip 13 arranged on the first electrode 12 and electrically connecting with the first electrode 12 and the second electrode 122 via two metallic wires 17, and an encapsulation 14 covering the LED chip 13 and the metallic wires 17 on the substrate 11.

The substrate 11 is a plate, and a first tenon is arranged on a bottom surface. In this embodiment, the first tenon which is extending from the bottom surface of the substrate 11 is a protrusion 15. The protrusion 15 is in the shape of a symmetrical trapezoid, having the longest side on the bottom surface of the substrate 11. The protrusion 15 has at least one inclined plane 151 inclining upwards towards the bottom surface of the substrate 11.

In this embodiment, a cross section of the protrusion 15 shows two inclined planes 151 extending downwards from the bottom surface of the substrate 11, and a flat 152 connecting to the two inclined planes 151. The flat 152 is parallel to the bottom surface of the substrate 11. In other embodiments, the protrusion 15 can have any other geometry having the two inclined planes 151. The substrate 11 can be sapphire, silicon, ceramic and metal and is formed in one piece.

The first and second electrodes 12, 122 arranged on the substrate 11 extend from the top surface of the substrate 11 to the bottom surface of the substrate 11. Solder points 16 are formed on bottoms of the first and second electrodes 12, 122 for electrically connecting to the circuit board 20. The thickness of the solder point 16 is the same as the height of the protrusion 15.

The circuit board 20 is used for supporting the LED 10. The LED 10 is connected to an external power source by the circuit board 20. The circuit board 20 is plate. An anti-solder layer 21 is arranged on the top surface of the circuit board 20. The anti-solder layer 21 forms a plurality of anti-solder pads 24 which are separated from each other. A solder area(s) 22 respectively defined by adjacent anti-solder layers 21 is exposed for connecting to the solder points 16 of the LED 10. A second engaging unit arranged on a part of the anti-solder pad 24 is used for embedding the protrusion 15 of the LED 10. In this embodiment, the second engaging unit is the recession 23 which acts as an initial guide and final locator for the protrusion 15 of the LED 10. Each of the three adjacent anti-solder pads 24 on a straight line corresponds to the LED 10. Two solder areas 22 are formed between each of the three adjacent anti-solder pads 24. Two solder areas 22 connect to the two solder points 16 of the LED 10. The second engaging unit is arranged at the center of the anti-solder pad 24 between the two solder areas 22 and is used for engaging the first tenon. The thickness of the anti-solder layer 21 is less than the thickness of the solder point 16 of the LED 10.

The position of the recession 23 depends upon the protrusion 15 of the LED 10. When the protrusion 15 meets the anti-solder pad 24, the solder points 16 of the LED 10 make contact with the two solder areas 22 on either side of the anti-solder pad 24.

Figure 2:
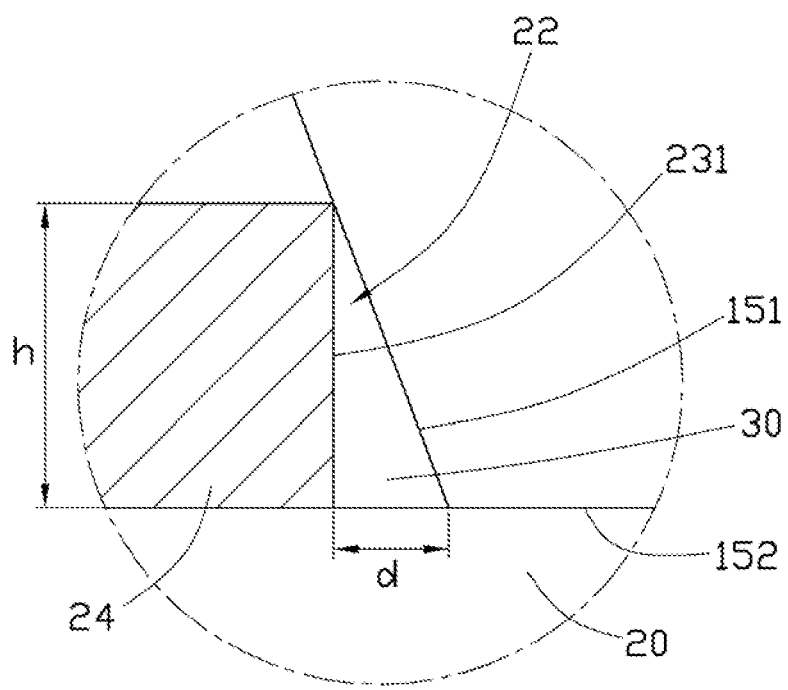
FIG. 2 is an enlarged drawing of circle II of the LED light bar of FIG. 1.

Referring to FIG. 2, when the LED 10 is arranged on the circuit board 20, the protrusion 15 of the LED 10 enters the recession 23, and the LED 10 is thus arranged on the circuit board 20. The recession 23 is a square void in a center of the anti-solder pad 24. The width of the recession 23 exceeds the smallest width of the protrusion 15 and is less than the largest width of the protrusion 15.

When the protrusion 15 is inserted into the recession 23, until the flat 152 of the protrusion 15 makes contact with the circuit board 20, the inclined plane 151 of the protrusion 15 contacts a side surface 231 of the recession 23 as defined by the anti-solder pads 24. In this embodiment, the smallest width of the protrusion 15 is equal to the width of the flat 152 of the protrusion 15. The side surface 231 of the recession 23 as defined by the anti-solder pads 24, by the inclined plane 151 of the protrusion 15, and by the top surface of the circuit board 20 forms a right triangle 30, where the height "h" of the right triangle 30 is equal to the thickness of the anti-solder pad 24. The length of the bottom "d" of the right triangle 30 is one half of the distance between two adjacent anti-solder pads 24, subtracting the width of flat 152 of the protrusion 15. The ratio of the height "h" and the length of the bottom "d" is equal to or greater than 2:1.

By applying this ratio, it can be ensured that the protrusion 15 is embedded into the recession 23. The length of the bottom "d" of the right triangle 30 is equal to the installation tolerance of the LED 10. For example, when the installation tolerance of the LED 10 is 0.1 mm, the length of the bottom "d" is at least 0.1 mm and the height is at least 0.2 mm. Thus, it can be ensured that the protrusion 15 is embedded into the recession 23 firmly. Because the protrusion 15 of the LED light bar extending from the bottom surface of the substrate 11 contacts the circuit board 20, any heat from the LED chip 13 is conducted quickly to the circuit board 20 by the protrusion 15. Thus, that enhances the heat dissipation of the LED light bar.

In another embodiment, the first tenon can be the recession 23 from the bottom surface of the substrate 11 caving towards an inside of the bottom surface of the substrate 11. The second engaging unit can be the protrusion 15 extending from the top surface of the anti-solder pad 24. The protrusion 15 of the anti-solder pad 24 enters the recession 23 with the substrate 11. Thus, the LED 10 can be precisely fixed.

FIG. 3 shows the process flow of the manufacturing of the LED light bar. A method for the manufacturing the LED light bar includes the following steps:

Provide the LED 10, with solder points 16 arranged on the bottom surface of the LED 10. The first tenon is arranged on the bottom surface of the LED 10. The first tenon is the protrusion 15 extending from the bottom surface of LED 10. The height of the protrusion 15 is equal to the thickness of the solder points 16.

Provide the circuit board 20, with an anti-solder layer 21 coated on the top surface of the circuit board 20. A plurality of the anti-solder pads 24 is formed on the anti-solder layer 21. Two solder areas 22 are formed between every three adjacent anti-solder pads 24. The second engaging unit is arranged on the middle one of the three adjacent anti-solder pads 24.

The LED 10 is arranged on the circuit board 10. The protrusion 15 is aligned with the second engaging unit. Thus, the protrusion 15 of the LED 10 is embedded in the second engaging unit. Therefore, the solder points 16 of the LED 10 are always maintained in precise alignment with two solder areas 22.

The circuit board 20 carrying the LED 10 is placed in the oven. Thus, the solder paste of the solder areas 22 melts. And then, cooling down. Thus, the solder areas 22 become conductively fixed on the solder points 16 of the LED 10.

While the disclosure has been described by way of example and in terms of an exemplary embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED light bar, comprising: an LED, a circuit board carrying the LED, a solder point is arranged on a bottom surface of the LED, and an anti-solder layer is coated on the circuit board, wherein a first tenon is between the LED and the anti-solder layer, and a second engaging unit is used for positioning the first tenon, the solder point being soldered to the circuit board.

2. The LED light bar of claim 1, wherein the second engaging unit is a recession defined in the anti-solder layer.

3. The LED light bar of claim 2, wherein the LED which is an LED package structure includes a substrate and an LED chip, the first tenon is a protrusion extending downwards from a bottom surface of the substrate, the protrusion includes at least one inclined surface inclining from the bottom surface of the substrate.

4. The LED light bar of claim 3, wherein the anti-solder layer includes a plurality of anti-solder pads, solder areas are defined by between the adjacent anti-solider pads, and the second engaging unit is the recession arranged in a corresponding anti-solder pad.

5. The LED light bar of claim 4, wherein the second engaging unit is corresponding to the first tenon, the first tenon is embedded into the second engaging unit, and the solder point contacts the solder areas.

6. The LED light bar of claim 4, wherein a right triangle is defined between a side face of the corresponding anti-solder pad, a portion of a top surface of the circuit board and a portion of the at least one inclined surface of the first tenon, the portion of the top surface of the circuit board having a length "d" and the side face of the corresponding anti-solder pad having a height "h" and a ratio of the height "h" and the length "d" being equal to or greater than 2:1.

7. A method for manufacturing an LED light bar, including steps:

providing an LED, a solder point arranged on a bottom surface of the LED, the LED having a first tenon;

providing a circuit board, an anti-solder layer arranged on a top surface of the circuit board, the anti-solder layer forming a plurality of anti-solder pads, a solder area respectively defined by the adjacent solder layers being exposed for connecting to the solder point of the LED, a second engaging unit arranged on a part of a corresponding anti-solder pad; and arranging the LED on the circuit board, the first tenon of the LED being embedded into the second engaging unit of the corresponding anti-solder pad, and the solder point connecting to the solder area.

8. The method for manufacturing the LED light bar of claim 7, wherein the second engaging unit is a recession defined in the corresponding anti-solder pad, the recession being a square void in a center of the corresponding anti-solder pad.

9. The method for manufacturing the LED light bar of claim 8, wherein the first tenon has at least one inclined surface inclining from the bottom surface of the substrate, the protrusion is embedded into the recession, and a right triangle is formed by a side surface of the corresponding anti-solder pad, the at least one inclined surface in the recession and a portion of a top surface of the circuit board in the recession and between the side surface and the first tenon.

10. The method of manufacturing the LED light bar of claim 9, wherein the portion of the top surface of the circuit board has a length "d" and the side surface of the corresponding anti-solder pad has a height "h" and a ratio of the height "h" and the length "d" is equal to or greater than 2:1.

* * * * *